(12) United States Patent
Ohta

(10) Patent No.: US 8,576,312 B2
(45) Date of Patent: Nov. 5, 2013

(54) SOLID-STATE IMAGE PICKUP DEVICE WITH PARTICULAR PIXEL ARRANGEMENT

(75) Inventor: Sougo Ohta, Ibaraki (JP)

(73) Assignee: Rosnes Corporation, Kyoto-shi (JP)

( * ) Notice: Subject to any disclaimer, the term of this patent is extended or adjusted under 35 U.S.C. 154(b) by 138 days.

(21) Appl. No.: 13/146,136

(22) PCT Filed: Feb. 2, 2010

(86) PCT No.: PCT/JP2010/051383
§ 371 (c)(1),
(2), (4) Date: Jul. 25, 2011

(87) PCT Pub. No.: WO2010/090166
PCT Pub. Date: Aug. 12, 2010

(65) Prior Publication Data
US 2011/0278653 A1    Nov. 17, 2011

(30) Foreign Application Priority Data
Feb. 4, 2009    (JP) ................................. 2009-023512

(51) Int. Cl.
*H04N 3/14* (2006.01)
*H04N 5/335* (2011.01)
*H04N 9/04* (2006.01)
*H01L 21/00* (2006.01)

(52) U.S. Cl.
USPC ............................. 348/275; 348/281; 438/70

(58) Field of Classification Search
USPC ............. 348/272, 273, 275, 280, 281; 438/70
See application file for complete search history.

(56) References Cited

U.S. PATENT DOCUMENTS

| | | | | |
|---|---|---|---|---|
| 5,119,181 | A * | 6/1992 | Perregaux et al. | 348/275 |
| 6,184,929 | B1 * | 2/2001 | Noda et al. | 348/280 |
| 6,646,682 | B1 * | 11/2003 | Hou | 348/280 |
| 6,956,605 | B1 * | 10/2005 | Hashimoto | 348/273 |
| 7,704,781 | B2 * | 4/2010 | McKee | 438/70 |
| 7,728,895 | B2 * | 6/2010 | Tanaka et al. | 348/302 |
| 7,742,088 | B2 * | 6/2010 | Shizukuishi | 348/272 |
| 7,825,970 | B2 * | 11/2010 | Choi et al. | 348/275 |
| 8,208,054 | B2 * | 6/2012 | Yamaguchi et al. | 348/272 |
| 8,314,866 | B2 * | 11/2012 | Massetti | 348/275 |
| 2006/0038904 | A1 * | 2/2006 | Kudoh | 348/308 |
| 2006/0119715 | A1 * | 6/2006 | Nam | 348/272 |
| 2006/0231739 | A1 * | 10/2006 | Sekine et al. | 250/208.1 |
| 2007/0177044 | A1 | 8/2007 | Maruyama et al. | |
| 2008/0088724 | A1 * | 4/2008 | Kudoh | 348/294 |

(Continued)

FOREIGN PATENT DOCUMENTS

| JP | 2004253740 A * | 9/2004 |
|---|---|---|
| JP | 2006-303468 | 11/2006 |

(Continued)

*Primary Examiner* — John Villecco
(74) *Attorney, Agent, or Firm* — Martin A. Motsenbocker; Mots Law, PLLC

(57) ABSTRACT

In a solid-state image pickup device according to this invention, because a photodiode 2 has a side close to a transfer transistor 3 is longer than an opposite side of the photodiode 2, the transfer transistor 3 can be increased in width. Therefore, it is possible to miniaturize the size of a pixel without causing deterioration in reading property. As a result, this invention can provide the solid-state image pickup device that achieves further miniaturization of pixels by applying an efficient layout of the pixels.

5 Claims, 14 Drawing Sheets

(56) References Cited

U.S. PATENT DOCUMENTS

| | | | |
|---|---|---|---|
| 2009/0090845 A1* | 4/2009 | Yin et al. | 250/208.1 |
| 2009/0295954 A1* | 12/2009 | Mori et al. | 348/294 |
| 2010/0066877 A1 | 3/2010 | Yamaguchi et al. | |
| 2010/0110237 A1* | 5/2010 | Hashimoto et al. | 348/273 |
| 2010/0157116 A1* | 6/2010 | Kikuchi | 348/272 |
| 2011/0249156 A1* | 10/2011 | Goto | 348/272 |

FOREIGN PATENT DOCUMENTS

| | | | |
|---|---|---|---|
| JP | 2007-201269 | | 8/2007 |
| JP | 2010010370 A | * | 1/2010 |
| JP | 2010212288 A | * | 9/2010 |
| JP | 2010216819 A | * | 9/2010 |
| WO | WO 2008/133146 A1 | | 11/2008 |

\* cited by examiner

US 8,576,312 B2

SOLID-STATE IMAGE PICKUP DEVICE WITH PARTICULAR PIXEL ARRANGEMENT

TECHNICAL FIELD

The present invention relates to a solid-state image pickup device, and particularly relates to a solid-state image pickup device in which an amplifier transistor and a reset transistor are shared by a plurality of pixels.

BACKGROUND ART

There have been widely used video cameras and electronic cameras in recent years. These cameras include solid-state image sensors such as CMOS image sensors. The solid-state image sensors each include an imaging block in which a plurality of photoelectric conversion blocks each configured by a photodiode are disposed in a two-dimensional array, and there are formed unit regions (unit pixels) each including the photodiode as a main functional part.

FIG. 12 is an explanatory diagram, exemplarily showing the configuration of an imaging block in a conventional CMOS image sensor and an equivalent circuit for one unit pixel. In the CMOS image sensor shown in FIG. 12, each unit pixel 100 includes a photoelectric conversion block configured by a photodiode 102 and three MOS transistors 103, 105, and 107 each of which converts signal charges into voltage signals to output the voltage signal (see Patent Document 1, for example).

Upon receiving light beams, signal charges (electrons) accumulated in the photodiode 102 are transferred to a floating diffusion (FD) block 104 through the electric charge transfer transistor 103 in accordance with readout pulses that are applied from a readout signal line 109 to a gate electrode of the electric charge transfer transistor 103. The FD block 104 is connected to a gate electrode of the amplifier transistor 105, and a variation in electric potential of the FD block 104 caused by the signal charges (electrons) is impedance-converted by the amplifier transistor 105 and is then outputted to a vertical signal line 15. The reset transistor 107 resets the electric potential of the FD block 104 so as to be equal to the electric potential of a power supply line 108 in accordance with a vertical reset pulse that is applied from a vertical reset line 14 to a gate electrode thereof.

The unit pixels 100 are scanned as follows, one time each in one cycle by a vertical shift register 11 as well as by a horizontal shift register 12. More specifically, when pulses are supplied from the vertical shift register 11 to one reset line 14 during a constant period of time in one cycle, the reset transistor 107 connected to the reset line is turned ON to cause the floating diffusion block 104 to be set to a high potential and to be selected. When there are selected pixels in a row corresponding to this reset line 14 by this operation, signals outputted from the respective pixels are transmitted to the corresponding vertical signal lines 15. During this constant period of time, horizontal select pulses are sequentially outputted from the horizontal shift register 12 to respective horizontal select lines 17, and signals outputted from the corresponding vertical signal lines 15 are sequentially extracted to horizontal signal lines 18 through horizontal select transistors 16, respectively. Upon completing the scanning of all the pixels in the same row, vertical select pulses are supplied to the reset line 14 in the following row so as to scan the respective pixels in this following row in the manner similar to the above. These operations are repeated to scan all the pixels in all the rows one time each during one cycle, and output signals thereof are extracted to the horizontal signal lines 18 in a time-series manner.

In recent years, there has been growing requirement for reduction in size of a solid-state image sensor for the purpose of adding camera functions to mobile apparatuses such as mobile phones. Such reduction in size of the solid-state image sensor as well as reduction in size of unit pixels for the purpose of increase in the number of pixels lead to reduction in light receiving area in one unit pixel, which deteriorates the properties of the solid-state image sensor such as the quantity of saturation signals and sensitivity.

In order to prevent such deterioration in property, there have been conventionally proposed a method of sharing photodiodes to reduce the number of transistors per unit pixel, as well as breakthroughs by optimization of the sharing method and the like (see Patent Document 2, for example).

However, since these are merely conceptual propositions, it has been difficult to preferably maintain the properties of the solid-state image sensor only by such methods.

PRIOR ART DOCUMENTS

Patent Documents

Patent Document 1: Japanese Unexamined Patent Publication No. 2006-303468
Patent Document 2: WO 2008/133146

SUMMARY OF THE INVENTION

Problem to be Solved by the Invention

The present invention has been made in view of the above circumstances, and an object thereof is to provide a solid-state image pickup device that achieves an efficient layout of pixels for further miniaturization of the pixels.

Solutions to the Problem

According to the present invention, there is provided a first solid-state image pickup device including on a semiconductor substrate: a plurality of photodiodes that are disposed in a matrix (i, j) to convert light beams into signal charges and accumulate the signal charges; an electric charge transfer transistor for reading out the signal charges accumulated in the photodiodes; a floating diffusion for converting into electric potentials the signal charges that are photoelectrically converted by the photodiodes and are read out by the electric charge transfer transistor; a reset transistor for resetting the signal charges; and an amplifier transistor for amplifying the read out signal charges, the reset transistor and the amplifier transistor being shared by the plurality of photodiodes, a distance d1 between a center of gravity of a region for sensing the light beams in a photodiode (i, j) and a center of gravity of a region for sensing the light beams in a photodiode (i, j+1) being different from a distance d2 between a center of gravity of a region for sensing the light beams in a photodiode (i+1, j) and a center of gravity of a region for sensing the light beams in a photodiode (i+1, j+1), and a distance d3 between the center of gravity of the region for sensing the light beams in the photodiode (i, j+1) and a center of gravity of a region for sensing the light beams in a photodiode (i, j+2) being equal to the distance d2, wherein each of the photodiodes has a side close to the transfer transistor is longer than a side opposite thereto.

According to the present invention, there is provided a second solid-state image pickup device including on a semiconductor substrate: a plurality of photodiodes that are disposed in a matrix (i, j) to convert light beams into signal charges and accumulate the signal charges; an electric charge transfer transistor for reading out the signal charges accumulated in the photodiodes; a floating diffusion for converting into electric potentials the signal charges that are photoelectrically converted by the photodiodes and are read out by the electric charge transfer transistor; a reset transistor for resetting the signal charges; and an amplifier transistor for amplifying the read out signal charges, the reset transistor and the amplifier transistor being shared by the plurality of photodiodes, a distance d1 between a center of gravity of a region for sensing the light beams in a photodiode (i, j) and a center of gravity of a region for sensing the light beams in a photodiode (i, j+1) being different from a distance d2 between a center of gravity of a region for sensing the light beams in a photodiode (i+1, j) and a center of gravity of a region for sensing the light beams in a photodiode (i+1, j+1), and a distance d3 between a center of gravity of the region for sensing the light beams in the photodiode (i, j+1) and a center of gravity of a region for sensing the light beams in a photodiode (i, j+2) being equal to the distance d2, wherein each of the photodiodes has a side close to the transfer transistor being longer than a side opposite thereto, and each of the photodiodes is axisymmetrical in one of an i direction and a j direction with respect to a center of gravity of an area of the photodiode, and is not axisymmetrical in the remaining direction.

EFFECTS OF THE INVENTION

According to the present invention, there is provided a solid-state image pickup device that has an efficient layout of pixels for achieving further miniaturization of the pixels as well as causes no residual image.

Figure 1:
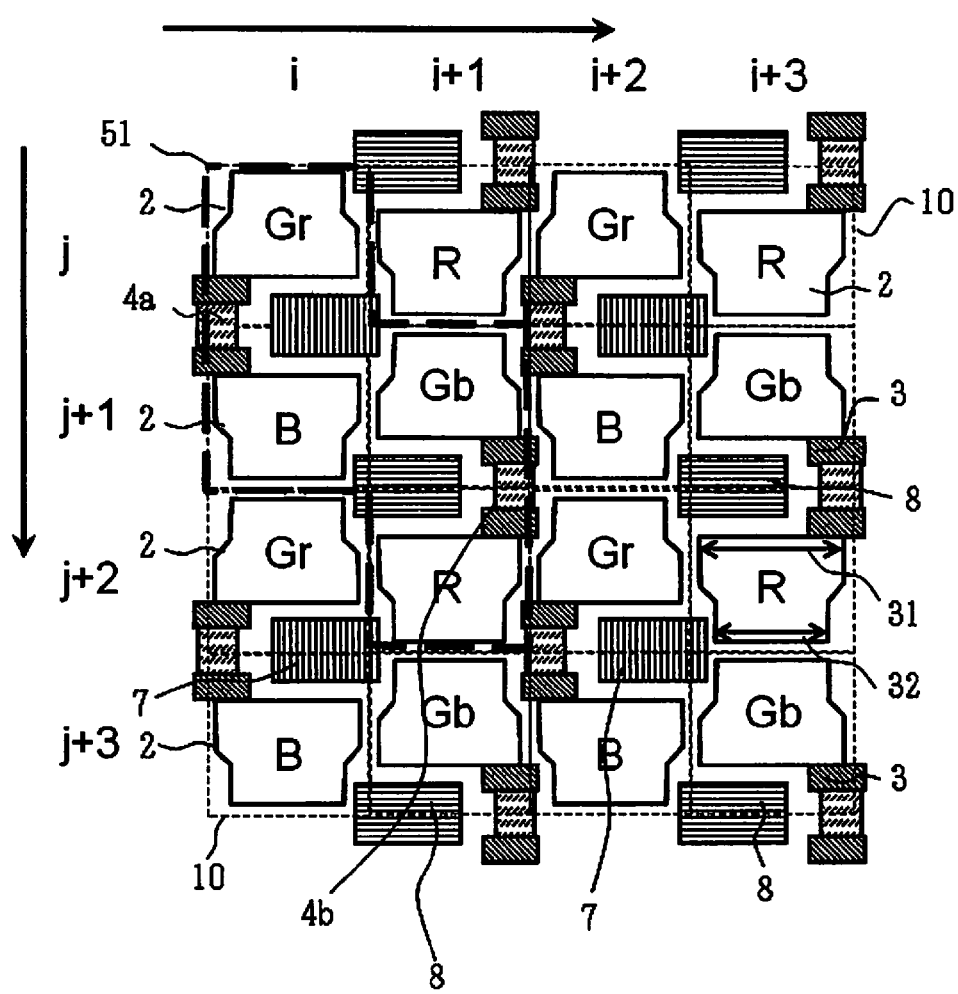
FIG. 1 is a diagram showing a layout in a pixel block of a CMOS image sensor according to a first embodiment.

DESCRIPTION OF SYMBOLS 2 photodiode
3 transfer transistor
4 floating diffusion
4a floating diffusion
4b floating diffusion
5 amplifier transistor
6 select transistor
7 reset transistor
8 power supply line
10 unit pixel
11 vertical shift register
12 horizontal shift register
14 reset line
15 vertical signal line
16 horizontal select transistor
17 horizontal select line
18 horizontal signal line
21 pixel size
22 width of photodiode
23 width of element isolation
24 width of floating diffusion
25 width of element isolation
26 width of reset transistor region
27 width of element isolation
28 reduced portion
29 active region
30 channel width
31 side of adjacent photodiode
32 opposite side of photodiode
33 potential deep portion of photodiode
51 cell
100 unit pixel
101 shared pixel
102 photodiode
103 electric charge transfer transistor
104 floating diffusion (FD) block
105 amplifier transistor
107 reset transistor
108 power supply line
109 readout signal line

MODES FOR CARRYING OUT THE INVENTION

Described in detail below are embodiments of the present invention shown in the drawings.

First Embodiment

FIG. 1 is a diagram best illustrating the feature of the first embodiment, schematically showing the configuration of a layout of pixels.

FIG. 1 shows unit pixels 10 of 16 pixels in total arranged to have four pixels in columns i, i+1, i+2, and i+3 in the row direction and four pixels in rows j, j+1, j+2, and j+3 in the column direction, and photodiodes 2 for performing photoelectric conversion are disposed in the respective pixels. Each of the unit pixels 10 is defined as a region on a substrate, which includes one photodiode block as a main functional part as well as parts necessary to achieve the function. Each of the photodiodes 2 is denoted by symbols B, R, Gr, or Gb. More specifically, the photodiode B is provided with a color filter for blue color so as to photoelectrically convert blue color. Similarly, the photodiode R photoelectrically converts red color, and the photodiodes Gr and Gb photoelectrically convert green color. Symbol Gr indicates that a corresponding photodiode is disposed next to a photodiode R, and symbol Gb indicates that a corresponding photodiode is disposed next to a photodiode B.

In FIG. 1, the four photodiodes 2 share a reset transistor 7 and an amplifier transistor 5. In the column i, transfer transistors 3 are disposed between the photodiodes 2 in the row j and the row j+1 to each perform the transfer operation from the corresponding photodiode 2 to a floating diffusion 4a. Further, a reset transistor 7 is disposed with an element isolation being interposed between the floating diffusion 4a and the reset transistor 7. In the column i+1, transfer transistors 3 are disposed between the photodiodes 2 in the row j+1 and the row j+2 to each perform the transfer operation from the corresponding photodiode 2 to a floating diffusion 4b. Further, an amplifier transistor 5 is disposed with an element isolation being interposed between the floating diffusion 4b and the amplifier transistor 5.

A group of unit pixels in which the four photodiodes 2 share the reset transistor 7 and the amplifier transistor 5 is referred to as a cell 51, which is called as a four-pixel-one-cell because one cell is generally configured by four pixels.

The present embodiment is mainly characterized by the optimization of the layout of the photodiodes 2, as well as is characterized in that a side 31 of a photodiode adjacent to a transfer transistor 3 is longer than an opposite side 32 of the photodiode. The effects of the present embodiment will be detailed later.

Figure 2:
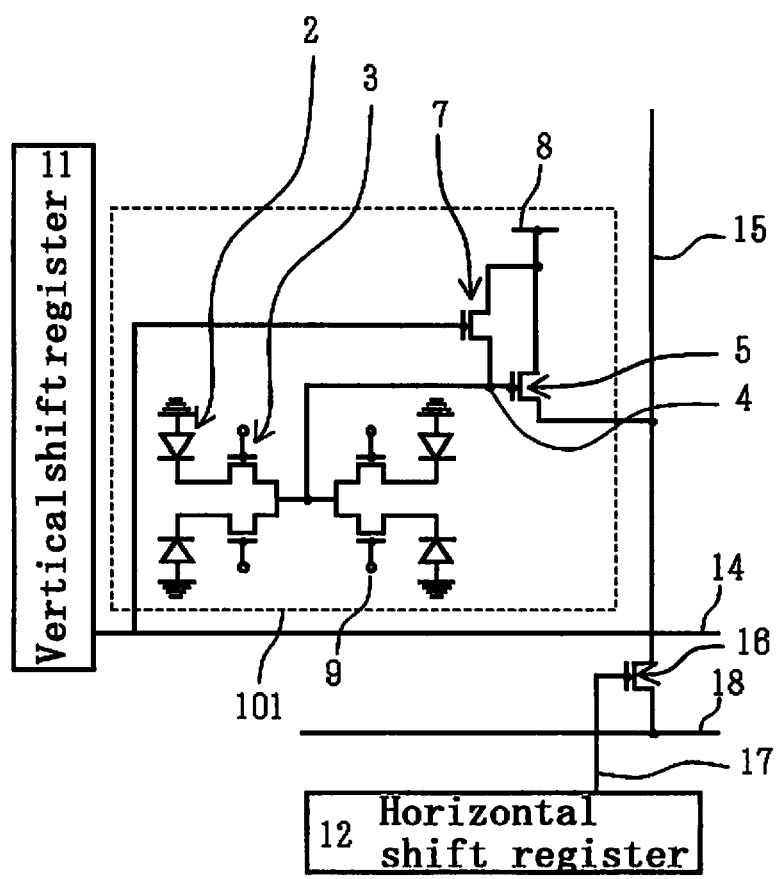
FIG. 2 is an explanatory diagram exemplarily showing the configuration of the CMOS image sensor according to the first embodiment, as well as an equivalent circuit of the CMOS image sensor in which four photodiodes share a reset transistor and an amplifier transistor.

Described next is a circuit configuration of an image pickup device in which photodiodes are shared in four pixels. FIG. 2 is an explanatory diagram exemplarily showing the configuration of an imaging block in a conventional CMOS image sensor in which the amplifier transistor 5 and the reset transistor 7 are shared in four pixels, as well as an equivalent circuit for the four shared pixels.

Figure 12:
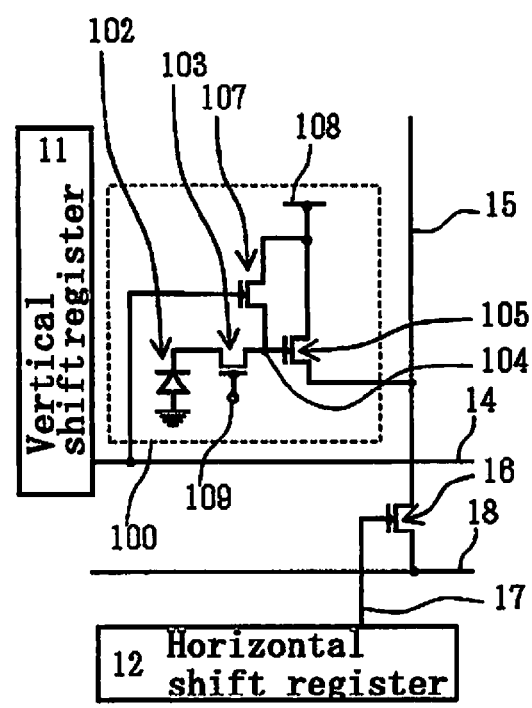
FIG. 12 is an explanatory diagram exemplarily showing an equivalent circuit of a conventional CMOS image sensor.

FIG. 12 is a circuit diagram in which photodiodes are not shared, and shows a circuit configuration different from that of FIG. 2 only in the following two points (1) and (2): (1) there are provided four photodiodes 2; and (2) there are provided four transfer transistors 3 in shared pixels 101.

The basic operations are performed as follows. Upon receiving light beams, signal charges (electrons) accumulated in the photodiode 2 are transferred to a floating diffusion 4 through one of the four transfer transistors 3 in accordance with readout pulses that are applied to a gate electrode of the transfer transistor 3. The floating diffusion 4 is connected to a gate electrode of the amplifier transistor 5, and a variation in electric potential of the floating diffusion 4 caused by the signal charges (electrons) is impedance-converted by the amplifier transistor 5 and is then outputted to a vertical signal line 15. The reset transistor 7 resets the electric potential of the floating diffusion 4 so as to be equal to the electric potential of a power supply line 8 in accordance with a vertical reset pulse that is applied from a vertical reset line 14 to a gate electrode thereof.

The shared pixels 101 are scanned by a vertical shift register 11 and a horizontal shift register 12 in the following manner. When pulses are applied from the vertical shift register 11 to the transfer transistors 3 for the photodiodes 2 to be read and an electric potential corresponding to the quantity of the electric charges transferred to the floating diffusion 4 is applied to the gate portion of the amplifier transistor 5, output signals of the pixels are transmitted respectively to the vertical signal lines 15. Horizontal select pulses are sequentially outputted from the horizontal shift register 12 to respective horizontal select lines 17, and the corresponding output signals are sequentially extracted to horizontal signal lines 18. Upon the completion of the series of operations, the operations of reading out the electric charge of the following photodiode are started. The subsequent operations are similarly performed, and upon the completion of the operations of reading out the four photodiodes, the photodiodes in the next row are subsequently read out.

Figure 3:
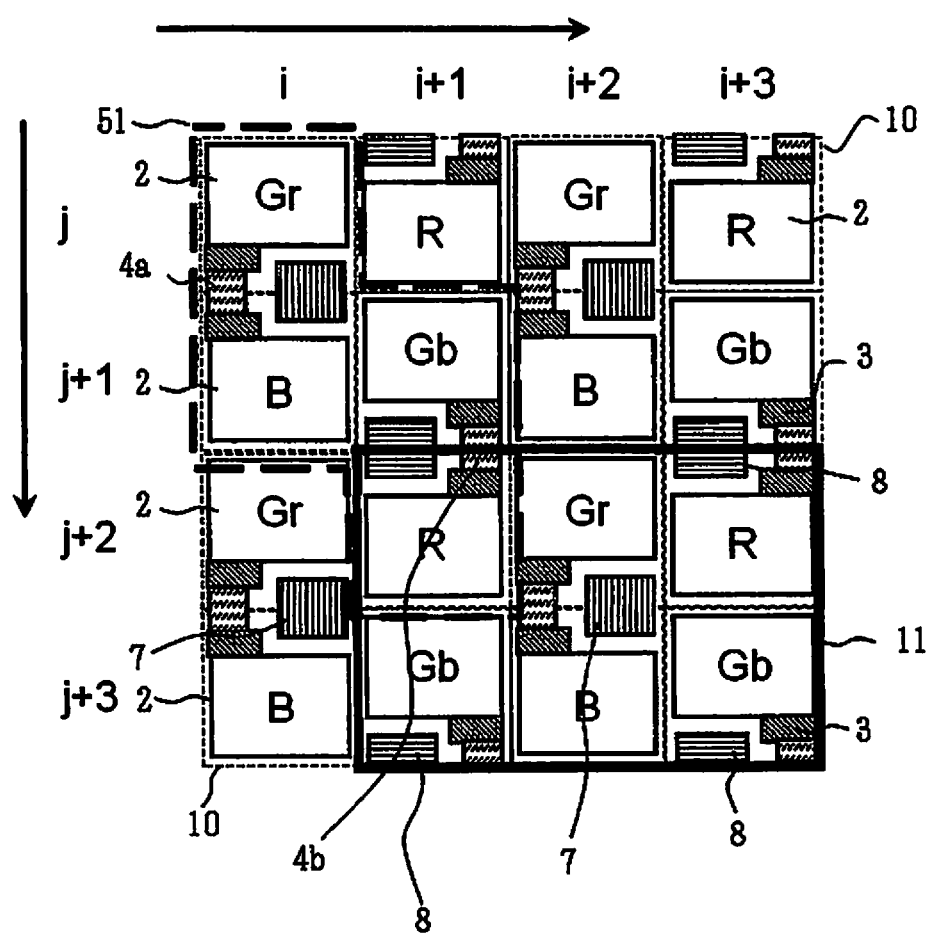
FIG. 3 is a diagram showing a layout in a pixel block of a conventional CMOS image sensor.
Figure 4:
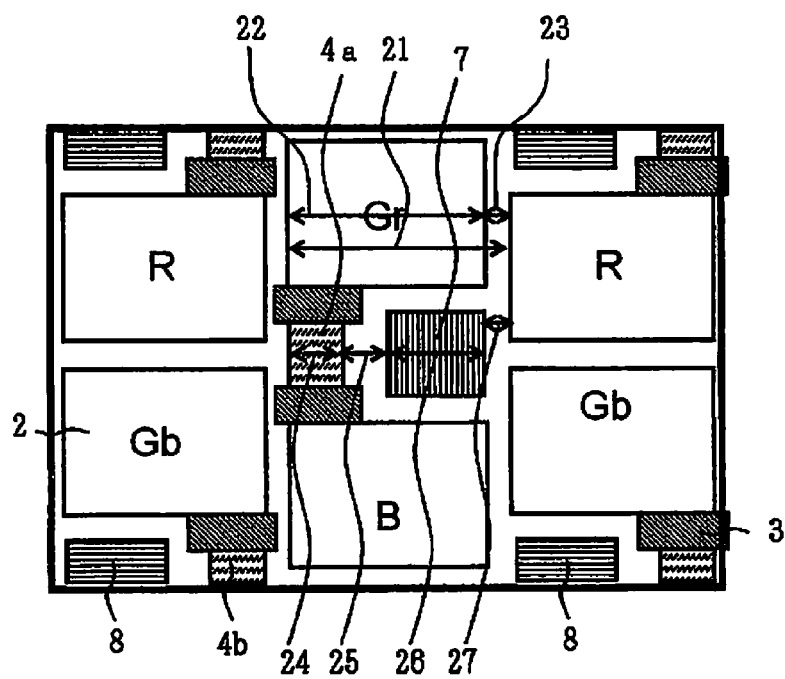
FIG. 4 is an enlarged diagram showing the layout in the pixel block of the conventional CMOS image sensor.

FIG. 3 is a diagram conceptually showing the arrangement of pixels as described in Patent Document 2, and FIG. 4 is an enlarged diagram showing a portion 11 of FIG. 3.

The size of a unit pixel is defined by the distance between a photodiode and a photodiode adjacent thereto, and the pixel size is denoted by an arrow 21. The pixel sizes are variously determined in accordance with the trends and applications of the image sensors. The pixels for mobile phones and digital cameras are required to be miniaturized in size, and are generally made to be 2 μm or less. In the arrangement of pixels shown in FIG. 4, the pixel size is equal to a sum of a width 22 of the photodiode 2 and a width 23 of an element isolation between the adjacent photodiodes. The larger photodiode has an area for receiving light beams and thereby to achieve an image sensor of high performance. However, there is a restriction to the width 23 of an element isolation (such as STI: Shallow Trench Isolation) by the requirement on the pixel size or by the design rule. Accordingly, in a case where a cell has the pixel size 21 equal to 1.75 μm and the minimum width 23 of the element isolation defined by the design rule is 0.25 μm, the photodiode has the width 22 equal to 1.5 μm.

The pixel size also restricts the horizontal width of the floating diffusion 4 in FIG. 4. A width 24 of the floating diffusion 4 corresponds to a width of a channel of the transfer transistor 3. If this channel width is reduced, the reading property of the transfer transistor 3 is deteriorated. Accordingly, this channel width is generally set to approximately 0.5 μm. A width 25 of the element isolation between the floating diffusion 4 and the reset transistor 7 is restricted by the design rule, and is set to 0.25 μm in this case. A width 26 of the reset transistor region is also restricted by the design rule, and is set to 0.9 μm in this case. A width 27 of the element isolation for isolating the reset transistor region 26 and the photodiode 2 adjacent thereto is also restricted by the design rule, and is set to 0.25 μm in this case. The design rule to be referred to herein corresponds to the CMOS logic 0.13 μm rule. The total sum of the numerical values recited above is equal to 1.9 μm. This design rule allows the miniaturization only down to 1.9 μm. In order to realize the pixel size of 1.75 μm, the channel width of the transfer transistor 3 needs to be reduced, that is, the width 24 of the floating diffusion needs to be reduced and thus the reading property thereof should be deteriorated. It is therefore difficult to achieve the pixel size of 1.75 μm in any case.

The present embodiment proposes the optimum layout of the photodiodes, in which the reading property is not deteriorated and the pixel size of 1.75 μm is achieved under the similar design rule.

Figure 5:
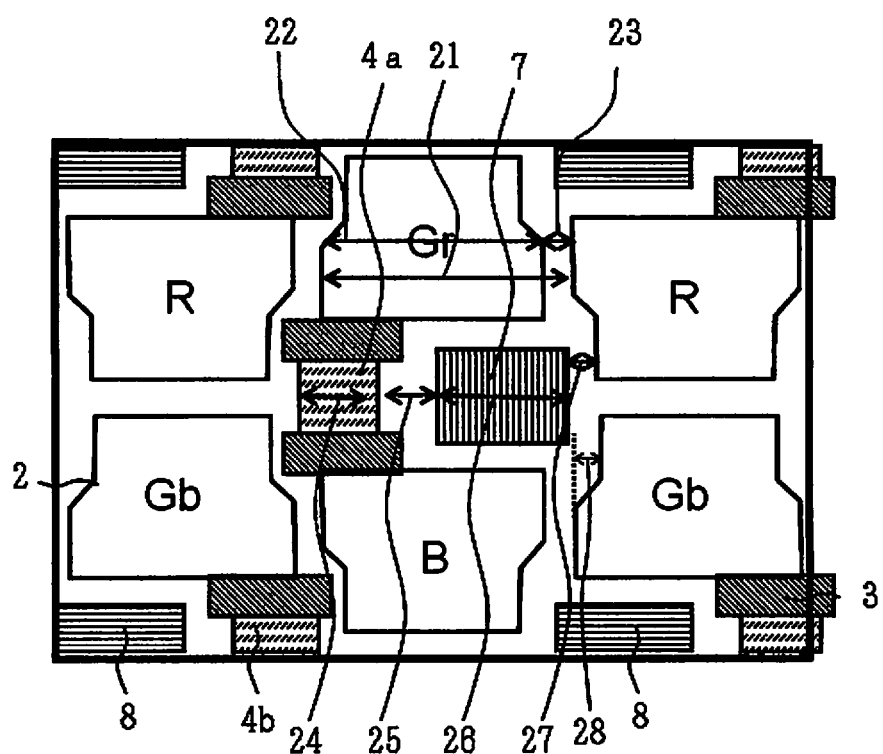
FIG. 5 is a diagram showing the layout in the pixel block of the CMOS image sensor according to the first embodiment.

FIG. 5 is a schematic diagram according to the present embodiment. In this diagram, the photodiode is denoted by symbol 2, the transfer transistor is denoted by symbol 3, the floating diffusion is denoted by symbols 4a or 4b, the reset transistor is denoted by symbol 7, the amplifier transistor is denoted by symbol 5, the pixel size is denoted by symbol 21, the width of the photodiode is denoted by symbol 22, the width of the element isolation between the adjacent photodiodes is denoted by symbol 23, the width of the floating diffusion is denoted by symbol 24, the width of the element isolation between the floating diffusion and the reset transistor region is denoted by symbol 25, the width of the reset transistor region is denoted by symbol 26, the width of the element isolation between the reset transistor and the photodiode is denoted by symbol 27, and a reduced portion of the photodiode is denoted by symbol 28, respectively.

Described next is the relative positions of the respective specific elements. The transfer transistor 3 is disposed close to the larger width of the photodiode. The floating diffusion 4a is disposed between the transfer transistors 3 adjacent to the upper and lower photodiodes, respectively. In FIG. 5, the sides of the photodiodes 2 each close to the corresponding transfer transistor are aligned in parallel with each other in the row direction. In this state, similarly to the ordinary layout described with reference to FIG. 4, the sides of the photodiodes 2 aligned in parallel with each other in the row direction are perpendicular to the sides of the photodiodes 2 in parallel with each other in the column direction.

While the photodiodes 2 illustrated in FIG. 4 each have a rectangular shape, the photodiodes 2 illustrated in FIG. 5 each have a polygonal shape. As shown in FIG. 5, the reduced portion 28 of the photodiode is formed by two vertices. This configuration enhances the flexibility in the layout of the width 24 of the floating diffusion 4 and the width of the transfer transistor. Therefore, it is possible to realize a cell of 1.75 µm even under the design rule applied to the case shown in FIG. 4.

As described with reference to FIG. 4, the width of 1.9 µm is required from the floating diffusion 4 to the element isolation 27. In the case where the pixel size needs to be equal to 1.75 µm, the difference therebetween of 0.15 µm needs to be reduced by the photodiode formed into the polygonal shape. The length of the reduction can be divided and added to the photodiodes located on the both sides thereof. The length of the reduced portion 28 of the photodiode is therefore equal to 0.075 µm.

FIG. 1 is an overview diagram showing pixels arranged in four rows and in four columns illustrated in FIG. 5. As apparent from this diagram, the photodiode 2 has the width 31 close to the transfer transistor 3, which is larger than the width 32 of the opposite side thereof.

Figure 6:
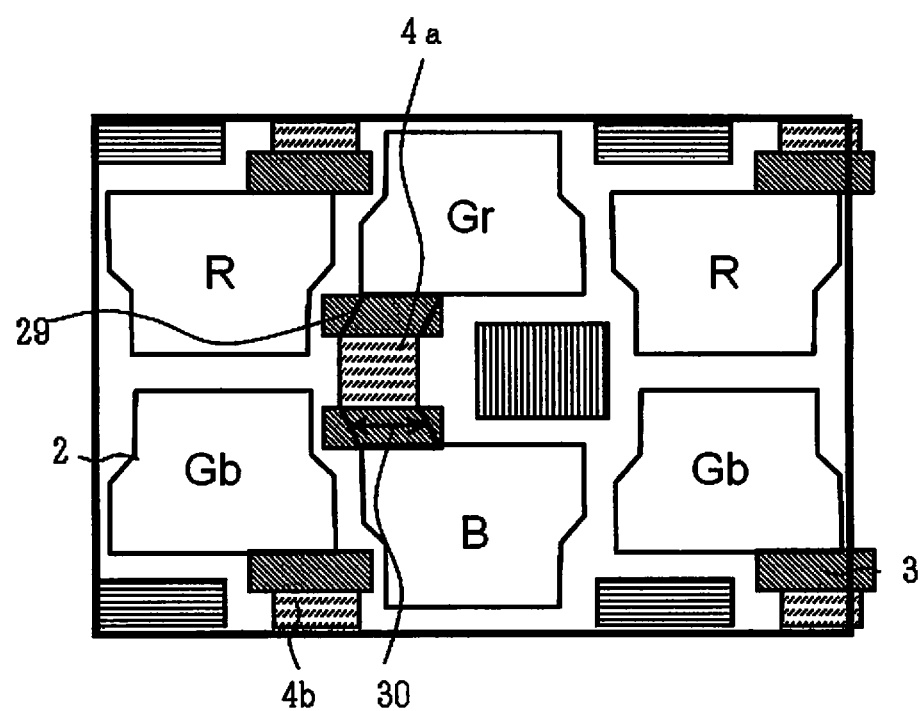
FIG. 6 is an enlarged diagram showing the layout in the pixel block of the CMOS image sensor according to the first embodiment.

FIG. 6 shows active regions 29 in the transfer transistors so as to clarify channel widths 30 of the transfer transistors shown in FIG. 5. In the case where the active region in the transfer transistor 3 is formed obliquely, the floating diffusion 4 can be displaced to achieve the miniaturization of the pixels under the restrictions of the design rule and the reading property.

Figure 13:
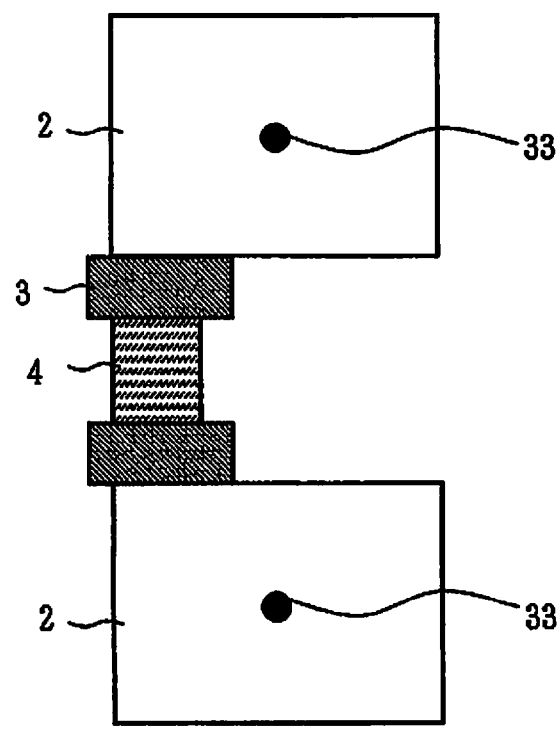
FIG. 13 is a diagram conceptually showing an effect of the layout according to the first embodiment.
Figure 14:
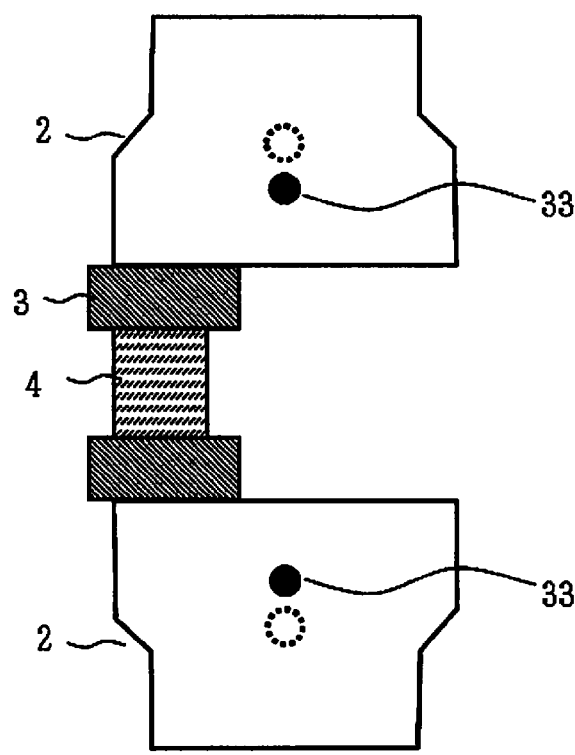
FIG. 14 is a diagram conceptually showing another effect of the layout according to the first embodiment.

FIGS. 13 and 14 are diagrams each conceptually showing the effects of the layout according to the present embodiment, in which the photodiode, the transfer transistor, and the floating diffusion are denoted by symbols 2, 3, and 4, respectively.

In FIG. 13, a potential deep portion of the photodiode is denoted by symbol 33, which is determined by the ion implantation and the heat treatment in the manufacturing process as well as by the layout of pixels. FIG. 13 shows an ordinary layout, in which the photodiodes 2 each have a rectangular shape. In this case, the potential deep portion 33 of each of the photodiodes is located substantially at the center of gravity of the photodiode 2.

FIG. 14 shows the layout according to the present embodiment. The potential deep portion 33 of the photodiode is shifted toward the transfer transistor 3 in accordance with the layout of pixels. Because the transfer transistor 3 and the potential deep portion 33 of the photodiode is close to each other, there is an exerted effect of perfect transfer. There is another exerted effect of the present embodiment that the layout can help such perfect transfer, which is hard to be achieved by the miniaturization of the cells.

Because the length of the reduction is divided and added to the photodiodes located on the both sides thereof, the shape of the photodiodes is made horizontally symmetrical with respect to the center of gravity of the photodiode. Therefore, the efficiency of light beams incident on the photodiode from the right and the efficiency of light beams incident on the photodiode from the left are equal to each other, which is also one of the features of the present embodiment.

Each of the photodiodes is vertically asymmetrical with respect to the center of gravity of the photodiode. However, the photodiodes in an identical color, such as the photodiodes R, B, or G have an identical shape, so as to easily realize correction by signal processing or the like.

Figure 7:
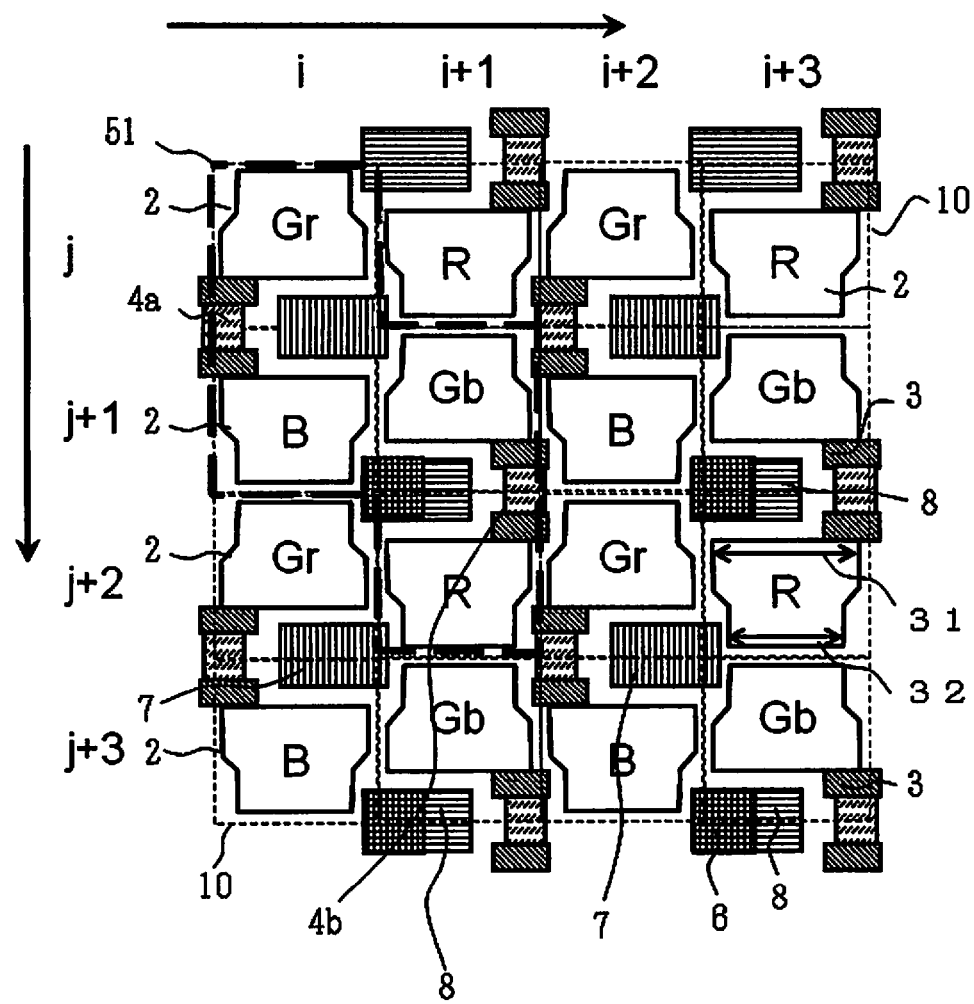
FIG. 7 is a diagram showing a layout in a pixel block of a CMOS image sensor including select transistors according to the first embodiment.

As shown in FIG. 7, the CMOS image sensor provided with a select transistor 6 also exerts the technical effects similar to those exerted in the case where any select transistor is not provided.

Figure 8:
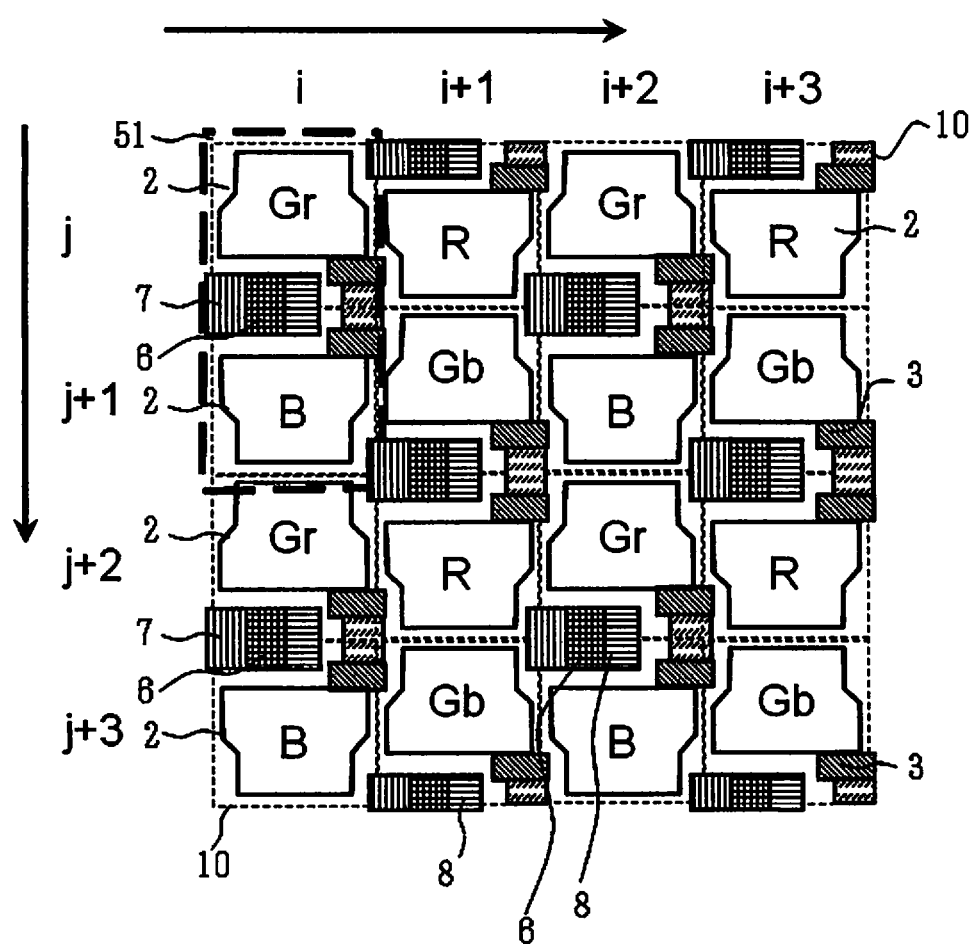
FIG. 8 is a diagram showing a layout in a pixel block of a CMOS image sensor according to the first embodiment, in which two photodiodes share a reset transistor, an amplifier transistor, and a select transistor.

Described above is the image sensor in which four photodiodes share the reset transistor and the amplifier transistor. The technical effects similar to those of the present embodiment will be exerted even in an image sensor of the type shown in FIG. 8 in which two photodiodes 2 share the reset transistor 7, the amplifier transistor 5, and the select transistor 6.

Even in a case where the element isolation 24 or 27 described with reference to FIG. 4 in relation to FIG. 7 is replaced with implant isolation achieved by implantation, the technical effects thereof are exerted similarly to those of the present embodiment.

This embodiment of the present invention realizes the pixel size of 1.75 µm or less even under the process rule of 0.13 µM while achieving the satisfactory reading property.

Second Embodiment

A second embodiment of the present invention is described in the following.

Figure 9:
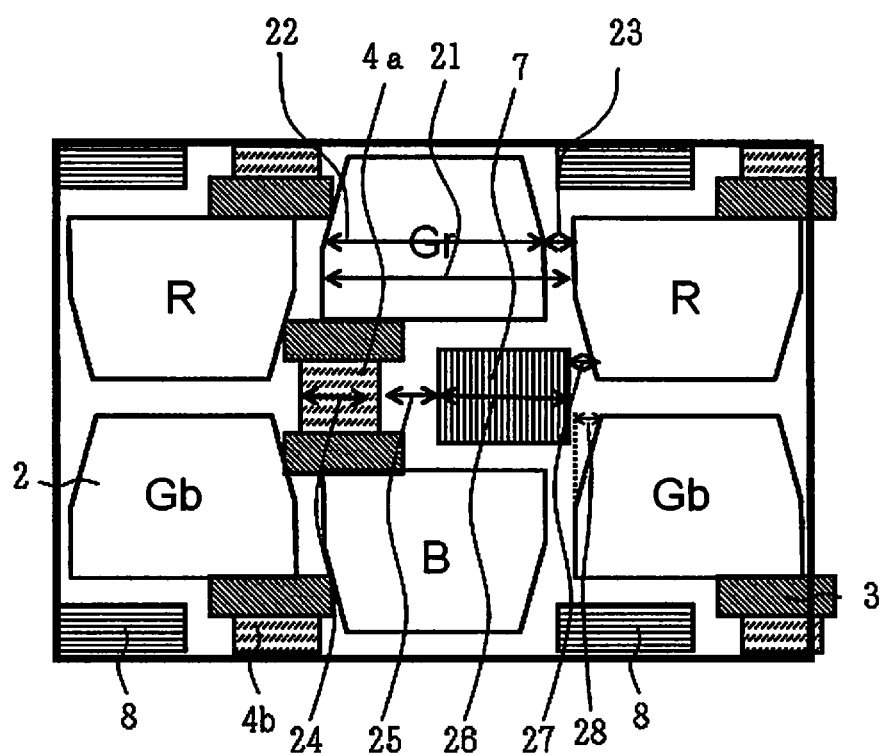
FIG. 9 is a diagram showing a layout in a pixel block of a CMOS image sensor according to a second embodiment.

FIG. 9 is a diagram showing a layout of pixels in a case of reducing the number of vertices of each photodiode in the polygonal shape according to the present embodiment. FIG. 9 is conceptually the same as FIG. 5, and is different from FIG. 5 in the shape of the photodiode.

The photodiode is denoted by symbol 2, the transfer transistor is denoted by symbol 3, the floating diffusion is denoted by symbol 4a or 4b, the reset transistor is denoted by symbol 7, the amplifier transistor is denoted by symbol 5, the pixel size is denoted by symbol 21, the width of the photodiode is denoted by symbol 22, the width of the element isolation between the adjacent photodiodes is denoted by symbol 23, the width of the floating diffusion is denoted by symbol 24, the width of the element isolation between the floating diffusion and the reset transistor region is denoted by symbol 25, the width of the reset transistor region is denoted by symbol 26, the width of the element isolation between the reset transistor and the photodiode is denoted by symbol 27, and the reduced portion of the photodiode is denoted by symbol 28, respectively.

Described next is the relative positions of the respective specific elements. The transfer transistor 3 is disposed close to the larger width of the photodiode. The floating diffusion 4a is disposed between the transfer transistors 3 adjacent to the upper and lower photodiodes, respectively. In FIG. 9, the sides of the photodiodes 2 each close to the corresponding transfer transistor 3 are aligned in parallel with each other in the row direction. In this state, similarly to the ordinary layout described with reference to FIG. 4, the sides of the photodiodes 2 aligned in parallel with each other in the row direction are perpendicular to the sides of the photodiodes 2 in parallel with each other in the column direction.

In FIG. 5, the reduced portion 28 of the photodiode is formed by the two vertices. To the contrary, the reduced portion 28 of the photodiode shown in FIG. 9 is formed only by one vertex. Similarly to the first embodiment, in the second embodiment, in a case where the total sum of the width 24 of the floating diffusion, the width 25 of the element isolation between the floating diffusion and the reset transistor region, the width 26 of the reset transistor region, and the width 27 of the element isolation between the reset transistor and the photodiode is larger than the pixel size, there is the reduced portion provided to the photodiode in order to realize the pixel size. In this case, the photodiode 2 shown in FIG. 9 has an area larger than that of the photodiode shown in FIG. 6, which is advantageous in view of the saturation property.

Figure 10:
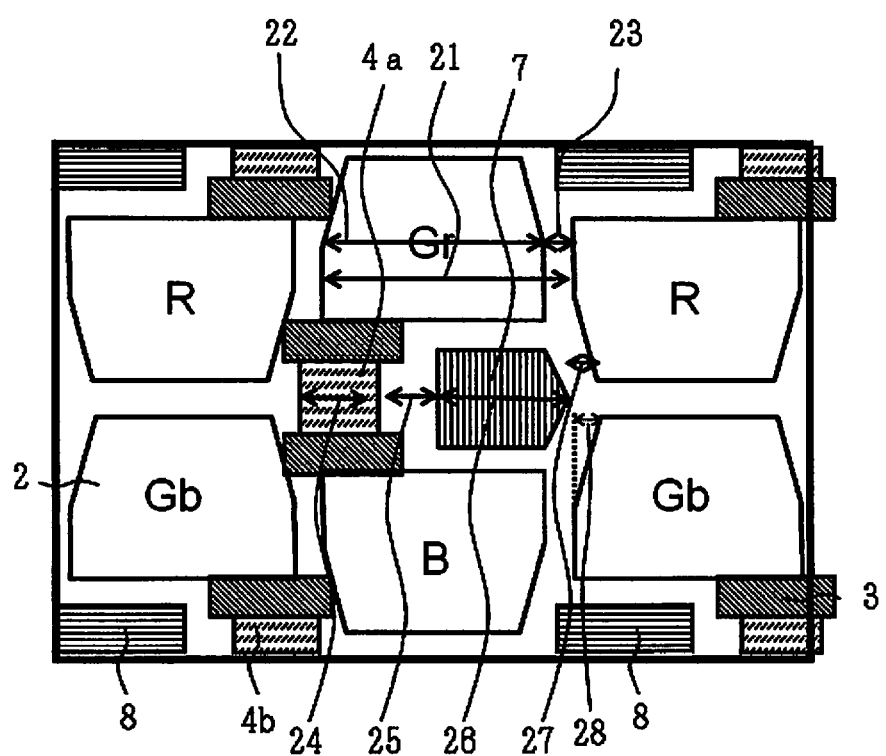
FIG. 10 is a diagram showing another layout in the pixel block of the CMOS image sensor according to the second embodiment.

As shown in FIG. 10, in a case of applying the design rule under which the reset transistor region 7 can be cut obliquely, this second embodiment is effectively adopted. More specifically, in a case where the width of the element isolation between the region of the reset transistor 7 and the photodiode is smaller than the size approved by the design rule, as in such a manner shown in FIG. 10, the active region for disposing the reset transistor or the amplifier transistor has sides respectively in parallel with the adjacent active regions. This configuration achieves the optimum layout with no deterioration in saturation property due to the reduction in size of the photodiode 2.

Figure 11:
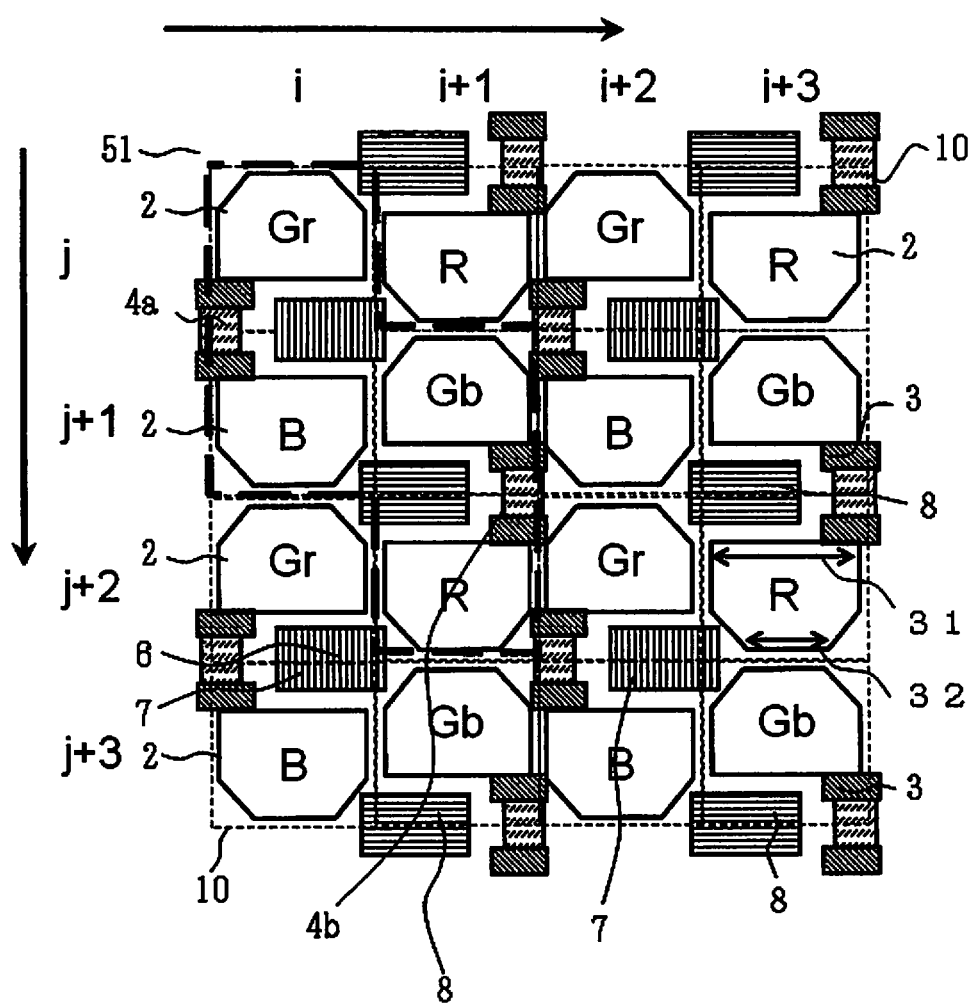
FIG. 11 is an overview diagram showing a layout in the pixel block of the CMOS image sensor according to the second embodiment.

FIG. 11 is an overview diagram showing pixels aligned in four rows and in four columns illustrated in FIG. 9. The width 31 of the photodiode 2 close to the transfer transistor 3 is made larger than the width 32 of the opposite side thereof. This configuration realizes the miniaturization of the pixel size even under the restriction of the design rule.

This embodiment of the present invention realizes the pixel size of 1.75 µm or less even under the process rule of 0.13 µm while achieving the satisfactory reading property.

Industrial Applicability

The solid-state image sensor, the manufacturing method therefor, and the solid-state image pickup device according to the present invention are applied to CMOS image sensors, electronic cameras, and the like, and contribute to reduction in size, increase in the number of pixels, and prevention of deteriorations of the imaging properties such as decrease in saturation signal amount and deterioration in sensibility. Moreover, the solid-state image pickup device according to the present invention may be widely utilized in cameras or camera systems for digital still cameras, mobile cameras, cameras for medical use, vehicle cameras, video cameras, monitoring cameras, security cameras, and the like, which concern high image quality.

The invention claimed is:

1. A solid-state image pickup device comprising on a semiconductor substrate:
   a plurality of photodiodes that are disposed in a matrix (i, j) to convert light beams into signal charges and accumulate the signal charges;
   an electric charge transfer transistor for reading out the signal charges accumulated in the photodiodes;
   a floating diffusion for converting into electric potentials the signal charges that are photoelectrically converted by the photodiodes and are read out by the electric charge transfer transistor;
   a reset transistor for resetting the signal charges; and
   an amplifier transistor for amplifying the read out signal charges,
   the reset transistor and the amplifier transistor being shared by the plurality of photodiodes,
   a distance d1 between a center of gravity of a region for sensing the light beams in a photodiode (i, j) and a center of gravity of a region for sensing the light beams in a photodiode (i, j+1) being different from a distance d2 between a center of gravity of a region for sensing the light beams in a photodiode (i+1, j) and a center of gravity of a region for sensing the light beams in a photodiode (i+1, j+1), and
   a distance d3 between the center of gravity of the region for sensing the light beams in the photodiode (i, j+1) and a center of gravity of a region for sensing the light beams in a photodiode (i, j+2) being equal to the distance d2, wherein
   each of the photodiodes has a side close to the transfer transistor is longer than a side opposite thereto, and wherein
   each of the photodiodes is provided with a large number of vertices on a side disposed in a direction perpendicular to the side close to the transfer transistor, the side disposed in the direction perpendicular to the side close to the transfer transistor connecting the side close to the transfer transistor and the side opposite thereto.

2. The solid-state image pickup device according to claim 1, wherein
   the number of the vertices is at least one.

3. The solid-state image pickup device according to claim 1, wherein
   the number of the vertices is at least two.

4. The solid-state image pickup device according to claim 1, wherein
   in each of the photodiodes, the side disposed in the direction perpendicular to the side close to the transfer transistor crosses the side close to the transfer transistor at right angles.

5. A solid-state image pickup device comprising on a semiconductor substrate:
   a plurality of photodiodes that are disposed in a matrix (i, j) to convert light beams into signal charges and accumulate the signal charges;
   an electric charge transfer transistor for reading out the signal charges accumulated in the photodiodes;
   a floating diffusion for converting into electric potentials the signal charges that are photoelectrically converted by the photodiodes and are read out by the electric charge transfer transistor;
   a reset transistor for resetting the signal charges; and
   an amplifier transistor for amplifying the read out signal charges,
   the reset transistor and the amplifier transistor being shared by the plurality of photodiodes,
   a distance d1 between a center of gravity of a region for sensing the light beams in a photodiode (i, j) and a center of gravity of a region for sensing the light beams in a photodiode (i, j+1) being different from a distance d2 between a center of gravity of a region for sensing the light beams in a photodiode (i+1, j) and a center of gravity of a region for sensing the light beams in a photodiode (i+1, j+1), and
   a distance d3 between the center of gravity of the region for sensing the light beams in the photodiode (i, j+1) and a center of gravity of a region for sensing the light beams in a photodiode (i, j+2) being equal to the distance d2, wherein each of the photodiodes has a side close to the transfer transistor is longer than a side opposite thereto, wherein an active region for disposing the reset transistor or the amplifier transistor has a polygonal shape provided with at least five sides, and each of the sides is in parallel with a side of an adjacent active region.

* * * * *